United States Patent [19]

Avramopoulos et al.

[11] Patent Number: 5,155,779
[45] Date of Patent: Oct. 13, 1992

[54] OPTICAL CIRCULATING SHIFT REGISTER

[75] Inventors: Hercules Avramopoulos, Red Bank, N.J.; M. Christina Gabriel, Washington, D.C.; Alan Huang, Middletown; Norman A. Whitaker, Jr., Atlantic Highlands, both of N.J.

[73] Assignee: AT&T Bell Laboratories, Murray Hill, N.J.

[21] Appl. No.: 787,988

[22] Filed: Nov. 5, 1991

[51] Int. Cl.$^5$ .......................... G02B 6/28; G01B 9/02; G11C 19/00; G11C 5/06

[52] U.S. Cl. .................................. 385/24; 385/31; 385/122; 385/42; 356/345; 377/54; 377/64; 377/72; 377/76; 365/64; 365/76; 365/77; 364/715.01; 364/715.08; 364/822; 364/824; 359/107; 359/341

[58] Field of Search .............. 385/11, 16, 17, 24, 385/31, 42, 88, 89, 122, 42; 356/345, 350; 377/54, 77, 78, 76, 81, 102, 64, 72; 365/64, 73, 76, 77, 78; 384/200, 713, 715.01, 822, 824, 715.08; 250/227.19, 227.27, 566, 568; 359/333, 331, 332, 108, 107, 341

[56] References Cited

U.S. PATENT DOCUMENTS

| | | | |
|---|---|---|---|
| 4,511,207 | 4/1985 | Newton et al. | 385/24 |
| 4,761,050 | 8/1988 | Byron | 385/16 |
| 4,881,788 | 11/1989 | Doran | 385/122 |
| 4,898,468 | 2/1990 | Udd | 356/345 |
| 4,923,265 | 5/1990 | Utaka et al. | 385/16 |
| 4,923,267 | 5/1990 | Su | 385/16 |
| 4,961,621 | 10/1990 | Su | 385/16 |
| 4,962,987 | 10/1990 | Doran | 385/122 |
| 4,973,122 | 11/1990 | Cotter et al. | 385/122 |
| 4,995,690 | 2/1991 | Islam | 385/8 |
| 5,032,010 | 7/1991 | Su | 385/24 |
| 5,046,848 | 9/1991 | Udd | 356/345 |
| 5,058,986 | 10/1991 | Nayar et al. | 385/122 |
| 5,078,464 | 1/1992 | Islam | 385/122 |

OTHER PUBLICATIONS

"Ultrafast switching with a single-fiber interferometer," M. J. LaGasse, et al., *Optics Letters,* vol. 14, No. 6, (Mar. 15, 1989).

"Ultrafast, low power, and highly stable all-optical switching in an all polarization maintaining fiber Sagnac interferometer," M. Jinno, et al., (Apr., 1990).

"Soliton switching in a fiber nonlinear loop mirror," M. N. Islam et al., *Optics Letters,* vol. 14, No. 15, (Aug. 1, 1989).

"Optical fiber switch employing a Sagnac interferometer," M. C. Farries, et al, *Appl. Phys. Lett.* 55(1), (Jul., 1989).

"All optical cascadable NOR gate with gain", M. N. Islam, *Optics Letters,* vol. 15, No. 8, (Apr., 1990).

"Pulsed-mode laser Sagnac interferometry with applications in nonlinear optics and optical switching," Y. Li, et al, *Applied Optics,* vol. 25, (Jan. 1986).

*Primary Examiner*—Brian Healy
*Attorney, Agent, or Firm*—J. A. Caccuro

[57] ABSTRACT

An all-optical circulating shift register encodes a received optical clock signal with a value derived from an encoded optical signal received at a control port thereof. A data input to the shift register is used to modify an encoded optical signal. The resulting encoded clock signal, appearing at an output port, is coupled back to the control port. The shift register uses the encoded clock signal at the control port to encode a subsequently-received clock signal. In one embodiment, the optical shift register is implemented using a Sagnac switch having a feedback path coupled between an output port and a control port of the Sagnac switch.

27 Claims, 4 Drawing Sheets

OPTICAL CIRCULATING SHIFT REGISTER

CROSS-REFERENCE TO RELATED APPLICATION

Related subject matter is disclosed in the following applications filed concurrently herewith and assigned to the same assignee hereof: U.S. patent application Ser. No. 07/787,989, pending, entitled "Optical Crossbar Exchange Arrangement" inventors Alan Huang and Normal Ashton Whitaker, Jr., and U.S. patent application Ser. No. 07,787,985, pending, entitled "Optical Linear Feedback Shift Register" inventors Hercules Avramopoulos, Alan Huang and Norman Ashton Whitaker, Jr.

BACKGROUND OF THE INVENTION

This invention relates to optical digital circuits and, more particularly, to an optical circulating shift register.

All-optical information processing holds promise for processing throughput rates which are much faster than electronics. Despite its relatively weak nonlinear index, silica optical fiber remains the most promising medium for realizing all-optical processing systems. The fiber loss is low enough that extremely long lengths can be used to compensate for the weak nonlinearity, and there is tremendous amount of existing technology that can be exploited in building a system. All-optical fiber Sagnac interferometer switches have been demonstrated in a number of different formats, and at extremely high speeds. Such Sagnac switches are extremely simple structures which are also immune to fluctuations in ambient conditions, and much experience has been accumulated in the development of Sagnac-based fiber optic gyroscopes.

To build an optical three-terminal Sagnac switch, a control beam must be used which is isolated from a separate signal beam. Two distinct optical wavelengths can be used, in which case lossless combination and separation of the control and signal can be effected using wavelength dependent couplers or filters. While the use of different wavelengths is an elegant scheme for a simple system, problems develop as the system grows in complexity, as identical devices of this type cannot be cascaded with an indentical device. Recently, a polarization-based Sagnac switch was demonstrated, in which polarization rather than wavelength was used to distinguish the control beam from the signal beam. Stable polarization-based interferometry is simply achieved in a Sagnac switch by using polarizing couplers.

Notwithstanding the progress made in implementing optical switches, before an all-optical information processing apparatus becomes a reality, a number of other electronic circuit functions need to be implemented in an optical environment.

SUMMARY OF THE INVENTION

In accordance with the present invention, an optical circulating shift register is implemented using an optical encoding means. The encoding means encodes a received optical clock signal with a value derived from an encoded optical signal received at a control port. The resulting encoded clock signal, appearing at an output port, is then coupled, or circulated, back to the control port. The encoding means uses the encoded clock signal at the control port to encode a subsequently received clock signal.

In one shift register embodiment, the encoding means is implemented using a Sagnac switch arrangement including an optical transmission medium having a controllable propagation speed characteristic. The Sagnac switch is modified to include a feedback pack connected between a non-reflecting output port thereof and a control port thereof. An optical clock signal is received at an input port of the Sagnac switch and an encoded data signal is received at the control port. The Sagnac switch encodes the clock signal received at the input port with a value derived from the encoded signal received at the control port. The encoded clock signal at the output port is then coupled back, via the feedback path, to the control port. The shift register also outputs the encoded clock signal.

In a second embodiment, the optical shift register is implemented using the Sagnac switch arrangement described above except that the feedback path connects a reflected output port of the Sagnac switch to the control port of the Sagnac switch. In this embodiment, the shift register alternately outputs the encoded clock signal and the inverse of the encoded clock signal.

BRIEF DESCRIPTION OF THE DRAWING

FIG. 22 shows a schematic representation of the optical shift register of FIG. 1;

DETAILED DESCRIPTION

Figure 1:
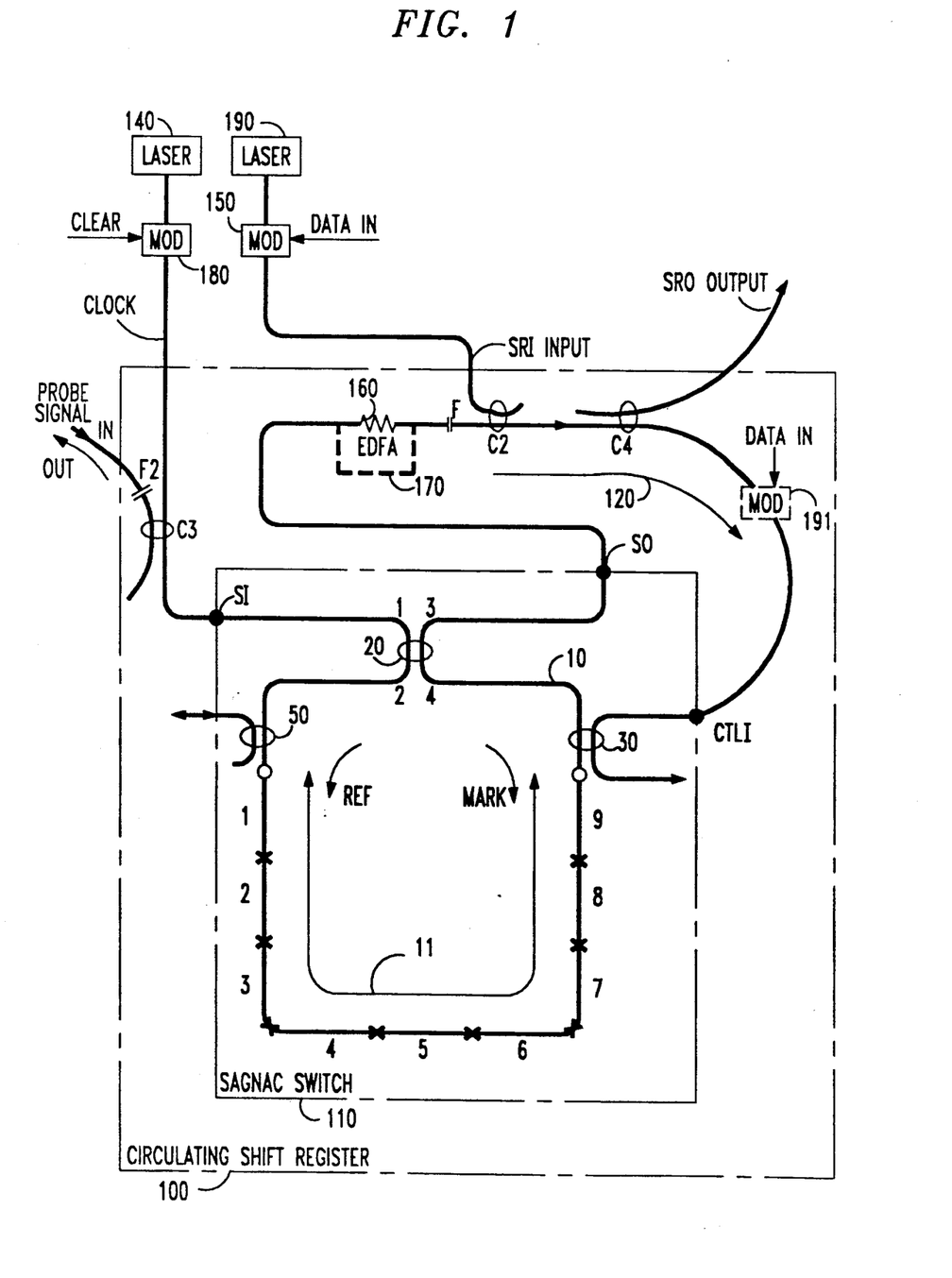
FIG. 1 illustrates a first embodiment of an optical circulating shift register in accordance with the present invention.

Shown in FIG. 1 is an illustrative diagram of our inventive optical circulating shift register 100 comprising an encoding means, implemented using a Sagnac interferometer switch arrangement 110 (hereinafter Sagnac switch), and a feedback path 120. Before describing the operation of the present invention we first describe the general operation of a Sagnac switch. Such a Sagnac switch is described in more detail in the copending United States patent application, Ser. No. 07/521774 of Gabriel, Houh and Whitaker entitled "Sagnac Optical Logic Gate," filed May 10, 1990, pending, which is incorporated by reference herein.

The Sagnac switch 110, illustratively, includes an optical transmission medium, i.e., an optical fiber 10, that is connected at both ends to a Polarization Maintaining Coupler (PMC) 20. An input clock signal is applied to an input SI which is port 1 of the coupler 20, ports 2 and 4 of coupler 20 are connected to the two ends of fiber 10, and port 3 of coupler 20 forms an output S0 of the Sagnac loop. Fiber 10 thus forms a loop, (also referred to herein as fiber loop 10) which in the context of this disclosure, refers to the path over which a signal travels and, more particularly, to arrangements where the path forms a closed, or nearly close, figure.

The Sagnac switch 110 operates as follows. In the following description it should be understood that the clock signal may be a single pulse or a plurality of pulses. Similarly, the data input and control signals may also be one or more pulses. An input clock signal applied to port 1 is split into two parts that exit coupler 20 at ports 2 and 4: a "mark" signal that travels clockwise, and a "ref" signal (reference signal) that travels counter-clockwise. The "mark" and "ref" signals travel through the loop in opposite directions, re-enter coupler 20 and recombine therein. Under normal circumstances, the "mark" and "ref" signals experience the same conditions as they travel through the loop. Even though the propagation speed is a function of many parameters that may be uncontrollable and may or may not change with time, the travel time of the "ref" and "mark" signals is short enough that, basically, all of the parameters remain static. Consequently, no changes occur within the loop to differentiate between the effects of the fiber on the signals traveling in the two directions. The result is a combining of signals in coupler 20 that is constructive with respect to port 1 and destructive with respect to port 3. In consequence, light that enters port 1 of the coupler 20 is completely reflected back to port 1, and no output is delivered to port 3.

In addition to the above-described structure, FIG. 1 includes a polarization combining coupler (PBS1) 30 that injects a control signal at port CTLI into a segment 11 of the fiber loop 10. Because coupler 30 is within the loop, the control signal travels along the loop only in one direction; and more specifically, coupler 30 is arranged to inject the control signal that travels along the loop in the direction of the "mark" signal. A polarization combining coupler (PBS2) 50 is also included within the loop of fiber 10 to extract the control pulse out of the loop once it has served its control function.

Segment 11 of fiber 10 is a variable refractive-index material that is characterized by the property that the propagation speed of a beam passing through the material is a function of the energy of the beam that passes through the material. Furthermore, not only does the propagation speed change for the beam (e.g., control signal) that effects the change in propagation speed, but it also changes the propagation speed of other beams (e.g., "mark" signal) that pass through the material at the same time. The nonlinear interaction between the control signal and the "mark" signal is by means of cross-phase modulation due to the optical Kerr effect. Of course, the entire length of fiber 10 may be made of such a variable refractive-index material, but for the sake of generality, FIG. 1 is drawn with only a limited segment being made up of this material. Also for the sake of generality, it should be pointed out that the loop of fiber 10 in FIG. 1 does not necessarily have to be fiber. It can be a waveguide, or other means for directing the flow of light.

In sum, the arrangement of FIG. 1 includes a fiber loop 10 having a controllable propagation speed material in segment 11, "mark" and "ref" signals traveling through the loop in opposite directions and combined in coupler 20 and a control signal that is injected at coupler 30 which travels in the same direction as the "mark" signal over segment 11 and extracted by coupler 50. When the "mark" and control signals are properly timed and conditioned, the result is a single-pole double-throw switch type apparatus. When the control signal is not present, the "mark" and "ref" signals are combined in coupler 20 as described above. The signal entering the switch at port 1 reflects out of the loop of fiber 10 and exits out of port 1 of coupler 20. However, when the control signal is present and is made to travel through segment 11 with the "mark" signal, the change in propagation speed of the "mark" signal that is caused by the control signal alters the phase of the "mark" signal arriving at coupled 20. When the energy in the control signal and the interaction interval within segment 11 (between the "mark" and control signals) are properly controlled, the resulting phase relationship between the "mark" and "ref" signals is approximately $\pi$ radians, meaning that the "mark" signal is about 180° out-of-phase to the "ref" signal. This causes the combining of the "mark" signal and the "ref" signal in coupler 20 to be completely destructive with respect to port 1 and completely constructive with respect to port 3. As a result, all of the energy exits at port 3 (non-reflected signal output port) rather than at port 1 (reflected signal output port). It may be noted in passing that the "ref" signal also passes through segment 11 and that its speed is also somewhat affected by the control signal. But, since the control signal and the "ref" signal travel in opposite directions, their interaction time is much shorter than the interaction time of the "mark" and the control signals.

To ensure the proper operation of the Sagnac switch (that is to minimize the distortion of the pulse which outputs at port 3) requires that the control signal completely traverse the "mark" signal during its transit through segment 11 of the fiber loop 10. This is accomplished by requiring that the material of segment 11 have a dual speed characteristic, one that propagates the control signal at a different rate than the "mark" signal. The difference in the propagation speed may be tied to any controllable parameter of the control signal, such as wavelength, intensity or polarization. As long as the control signal completely traverses the "mark" signal within segment 11 the Sagnac switch operation is completely insensitive to the shape of the control signal or its precise timing. Rather, it is only sensitive to the overall energy of the control signal (integral of the control pulse).

In the present embodiment since the control signal is actually the non-reflected output signal SO from the Sagnac switch 110 which is fed back via path 120, the control signal must have the same wavelength as the input signal. Thus, segment 11 is selected to have a controllable parameter based on polarization alone or on polarization and intensity together. The length of segment 11 must be selected together with the controllable parameter to ensure that the control signal can traverse or "slip" past the "mark" signal within the length of segment 11, even though the "mark" signal precedes the entrance of the control signal into segment 11.

With continued reference to FIG. 1, we describe the operation of a circulating shift register 100 in accordance with the present invention. In our illustrative embodiment, the fiber loop 10 is formed from polarization maintaining fiber (PMF). A polarization maintaining coupler (PMC) is used as a coupler 20 to form the Sagnac switch. The clock signal is split into two equal signals (i.e., "mark" and "ref" signals) by coupler 20, which each traverse the loop in different directions and recombine interferometrically at coupler 20. The clock signal is held in a single linearly polarized state in fiber loop 10, and the control signal is introduced into fiber loop 10 in an orthogonal state using a polarization combining coupler (PBSI) as coupler 20. A polarization splitting coupler (PBS2) is used as coupler 50 to extract the control signal out of fiber loop 10. With ideal components this makes possible lossless combination and perfect isolation of the control and the "mark" and "ref" signals.

The length of segment 11 of the loop consists of an odd number of sections and an even number of crossed-axis splices. Segment 11 of the loop is illustratively shown as consisting of 9 sections, separated by 8 crossed-axis splices (i.e., adjacent sections are connected such that the birefringent axes are orthogonal.) Using the predetermined birefringence characteristics of the fiber loop 10 this corresponds to a determinable amount of slip between the control signal and the "mark" signal in each section. These splices allow the control signal and "mark" signal to multiply interact (i.e., alternately traverse or slip by each other) and provides other benefits such as jitter independence, removal of coherence problems, and pulse shape tolerance.

When control signal CTLI is absent, the recombining "mark" and "ref" signals interfere at coupler 20 so that a combined signal is reflected back into input port 1 of the Sagnac loop 110. With the control signal CTLI present, a nonlinear phase shift on the half of the clock signal ("mark" signal) with which it co-travels causes a combined signal to be transmitted to port 3 rather than reflected out at port 1. The transmitted or non-reflected signal SO from Sagnac switch 110 is logically equivalent to the control signal CTLI (delayed) and is amplified by an erbium-doped fiber amplifier (EDFA) 160 and fed back, via feedback path 120, to provide control signal CTLI. Note, the feedback path 120 adds a small predetermined time delay to the feedback signal. While the amplifier 160 in feedback path 120 has been described as an erbium amplifier, other optical amplifiers may be utilized. Additionally, it should be noted that this amplifier may be placed in loop 10 rather than in feedback path 120.

In an alternate embodiment, the erbium amplifier (EDFA) 160 is eliminated and replaced by path 170. Such an embodiment is useful when 1) losses at the various splices are very small, 2) sufficient crossed-axis splices exist, 3) the segment 11 length is sufficiently long or 4) enhanced non-linear refractive index fiber is used. Any one or combination of these characteristics may result in an unamplified feedback control signal still having enough energy to create sufficient propagation speed changes needed to enable the control signal to give a substantially 180° phase shift to the "mark" signal.

Note, that the optical fiber of feedback loop 120 is rotated 90 degrees before it is connected to coupler 30. This establishes the orthogonal polarization of control signal CTLI with respect to the polarization of the clock signal, thereby insuring that the control signal does not interferometrically combine with the clock signal during their transit through fiber loop 10. The polarization of the control signal CTLI is set at the fast transit polarization angle of loop 10.

The length of the feedback loop 120 is selected so that the first control signal CTLI arrives at coupler 30 a predetermined period of time after the first clock signal arrives there. As previously discussed, the length of segment 11 of loop 10 is such that a control signal, travelling on the fast transit polarization angle of loop 10 will completely traverse (or slip past) its associated "mark" clock signal, travelling on the slow transit polarization angle of loop 10. As previously discussed in detail, this ensures that the "mark" clock signal will traverse loop 10 faster than the "ref" clock signal so that the combining at coupler 20 is completely destructive with regard to port 1 and completely constructive with regard to port 3. As a result, all of the energy of the clock signal emerges at port 3.

The combined length of loop 10 together with feedback path 120 holds a predetermined number of clock signals (e.g., a frame of clock pulses). Thus, the transit through loop 10 and feedback path 120 takes a predetermined time interval (one frame time). The ratio of the length of feedback path 120 to the length of fiber loop 10 is not critical, so long as the fiber loop 10 is long enough to provide the required slip.

The data input may be generated by using a widely available optical modulator 150 of FIG. 1 to encode the input data pattern onto an optical pulse stream from laser 190. This encoded pattern of optical pulses (i.e., the data) is inputted, via SR input lead and coupler C2, into circulating shift register 100. The clock signal, illustratively derived from laser 190, is inputted serially into the input lead SI of the Sagnac switch 110.

It should be noted that data can be entered into the shift register 100 by using several means: 1. modulating the clock signal (MOD 480 of FIG. 4); 2. coupling a separate optical signal into the feedback loop (C2 of FIG. 1); 3. modulating the signal in the feedback loop (MOD 191 of FIG. 1); 4. entering data via a second control port (coupler 50 of FIG. 1) of the Sagnac switch 110.

Figure 2:
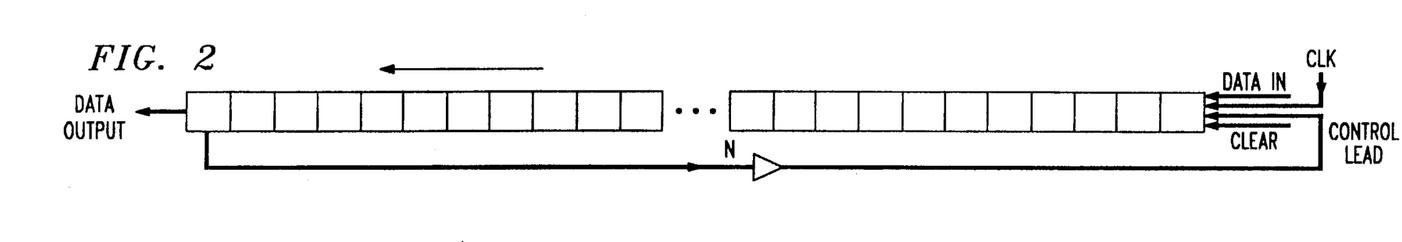

As shown in FIG. 2, the above configuration implements an optical equivalence of an N bit circulating shift register with an amplifier in its feedback path. The bit length N of the shift register is determined by both the time between input pulses and the time it takes the light pulses to traverse the entire circuit. In FIG. 1, the clock signal 130 is provided by the pulsed laser 140. The power supply is provided by the erbium amplifier 160. The data input is provided, illustratively, by a modulator 150 coupled to a laser source 140 and coupled via coupler C2, into the shift register 100. The data output is provided by a coupler C4, illustratively, connected to the feedback loop 120. A clear shift register function is provided, illustratively, by modulator 180 in series with the pulsed laser 140 clock source. A narrowband filter F is used to prevent the circulating shift register 100 from lasing through leakage around the fiber loop 10 and feedback loop 120.

Figure 3:
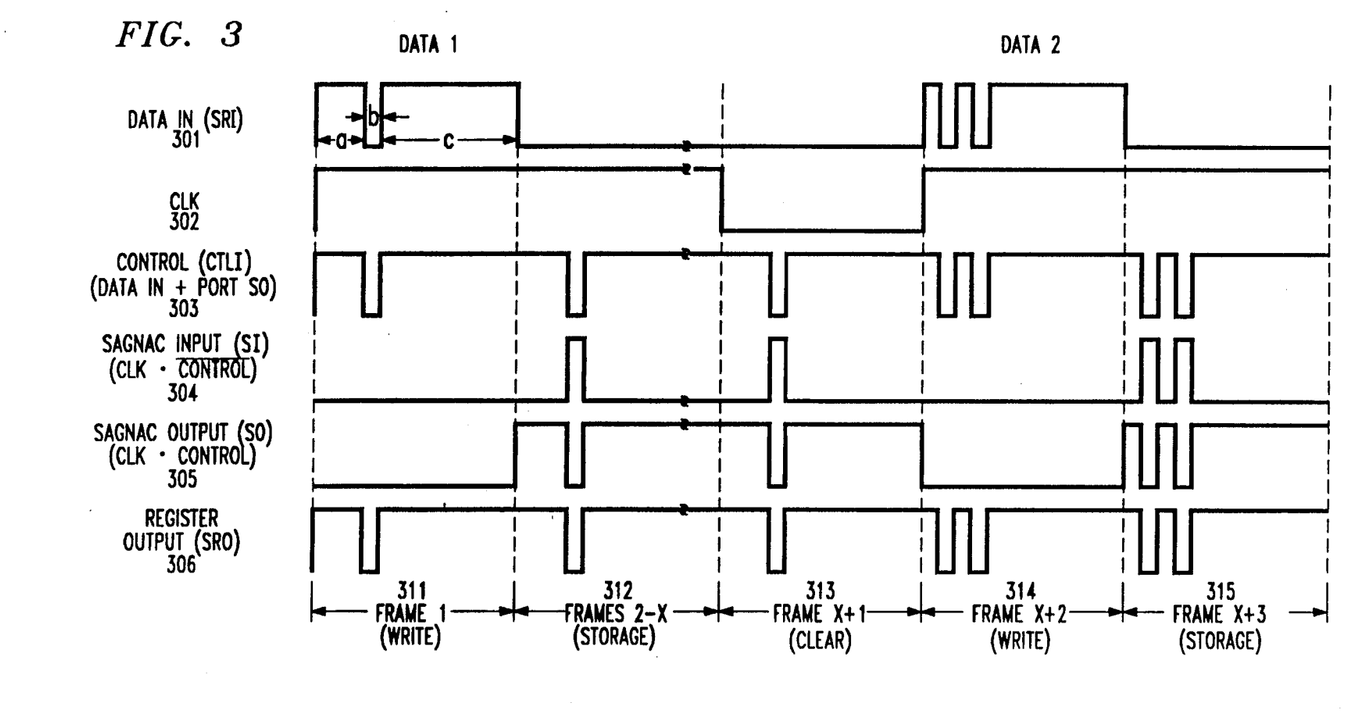
FIG. 3 shows a timing diagram of the various optical pulse signals associated with the operation of the optical shift register.

With joint reference to FIG. 1 and the timing diagram of FIG. 3, we illustrate the operation of the invention for particular data input sequences. Note, in the following paragraphs all three digit references beginning with the number three are located in FIG. 3, other references are found in FIG. 1.

FIG. 3 illustrates two data storage operations DATA 1 and DATA 2. For example, data storage operation one includes a data input (write) frame 311, data storage frames 312 and a data clear frame 313. Data storage operation two includes a data write frame 314 and data storage frames 315.

In the following discussion it is assumed that there is no delay in feedback path 120. Additionally, the clock signal and data signal comprise a plurality or frame of pulses. For clarity, rather than depict individual optical pulses, the envelope of the optical pulses is illustrated for the data input (SRI) 301, clock 302, control 303, Sagnac switch input (SI) 304, Sagnac switch output (SO) 305 and shift register (SRO) output 306. For example, the first frame of data inputted at data input 301 of FIG. 3, write frame 311, includes a string of pulses (a) representing logic 1 bits, followed by an absence of pulses (b) representing a string of logic 0 bits, followed by a string of pulses (c) representing logic 1 bits.

At the start of the timing sequence, there is no light in the Sagnac loop and Sagnac ports SI and SO are logic 0. The control input sequence at CTLI and the shift register output sequence SRO are logically equivalent to the data in sequence 301 (DATA 1) during write frame 1, 311. During frame 2, and for subsequent frames, 312, the sequence at port SO is derived from the sequence at port CTLI of the previous frame. For example, the Sagnac at port SO during frame 312 is the same as the sequence at port CTLI during frame 311. The sequence at port SI is the logical complement of the sequence at port SO. The shift register output port SRO always carries the same sequence as port CTLI. This pattern continues indefinitely as long as the clock pulses are supplied. That is, in our example, the various sequences in frames 2 through X are the same.

To completely clear the shift register, the clock signal 302 is interrupted for one complete frame using the clear modulation 180. This is shown in the clear frame 313. The output sequence SRO persists during the clear frame 313 as the Sagnac loop is emptied of light. During the second data write frame 314, the new data input sequence DATA 2 appears immediately both at the shift register output SRO and at the control port CTLI. The SO and SI ports have no signals during this frame as the loop is being refilled with sequence DATA 2. The DATA 2 sequence persists in the shift register, as shown by frame 315.

It should be noted in FIG. 3, that the control signal CTLI is the logical "ORing" of the data input signal and the port SO signal of Sagnac switch 110. The output at port SI (i.e., the reflected output at SI) is the logical "ANDing" of the clock pulses and the inverse of the control signal CTLI, (i.e., $\overline{CTLI}$). The output at port SO is the logical "ANDing" of the clock pulse and the control signal CTLI. Finally, the output SRO of the circulating shift register 100 is the same as the control signal CTLI. Note, with reference to FIG. 1, if desirable, the output coupler C4 can also be placed prior to the data in coupler C2 in feedback loop 120. In such an embodiment, the output SRO would have no "data in" signal present during the write frame 311, that is, SRO would then have the same sequence as Sagnac port SO.

Figure 4:
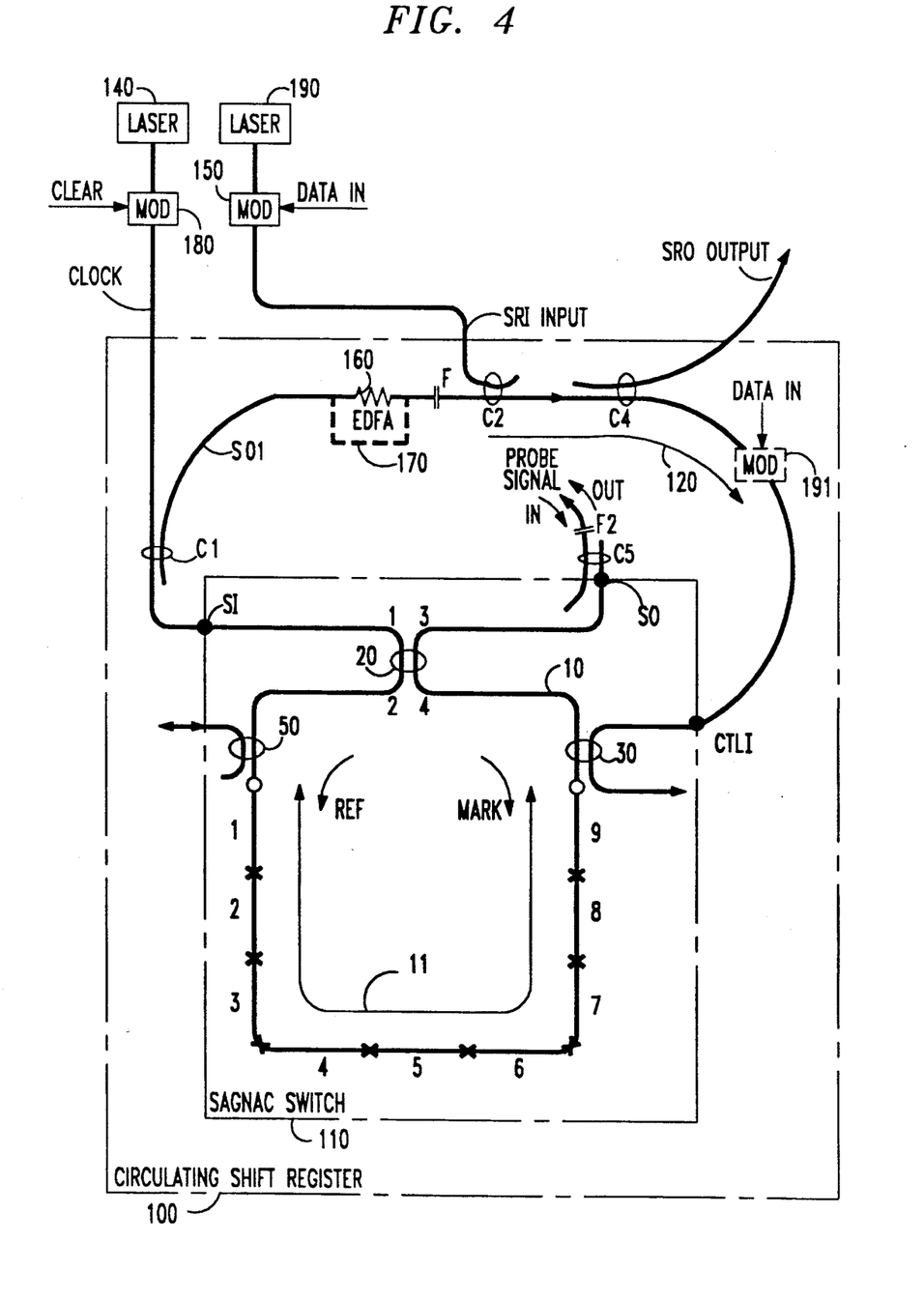
FIG. 4 shows a second embodiment of an optical shift register in accordance with the present invention.

Shown in FIG. 4 is a second embodiment of our invention. FIG. 4 is very similar to the arrangement of FIG. 3 except that the feedback loop 120 extends between coupler 1 on the input port SI and the control port CTLI of Sagnac switch 110. The FIG. 4 embodiment offers the advantage of having the "data in" and its inverse signal available at the output SRO during alternate frames. This embodiment also keeps the amplifier power constant.

Figure 5:
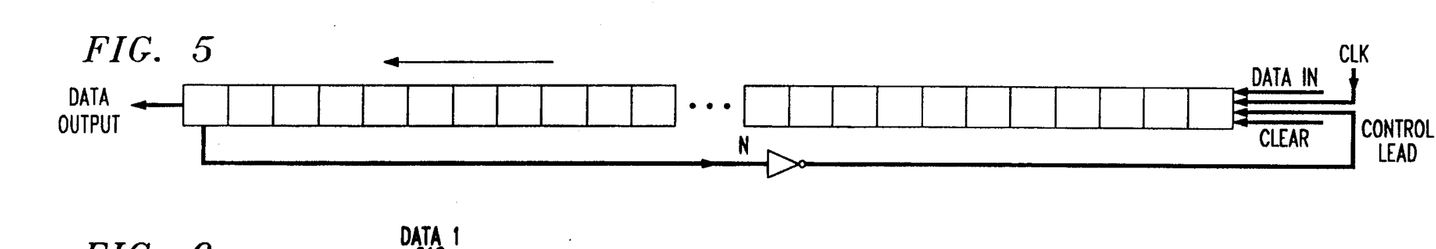
FIG. 5 shows a schematic representation of the second embodiment.

FIG. 5 depicts a schematic representation for the shift register embodiment illustrated in FIG. 4. This schematic is distinguished from that of FIG. 2 by the presence of a logical inverter in the feedback path. The inverter forms the logical complement of the data in the loop after every round trip (one frame). Thus the stored data sequence at the output SRO is logically complemented in alternate frames. A clear operation can take place during any frame, and a write operation can take place during any frame after a clear operation.

Figure 6:
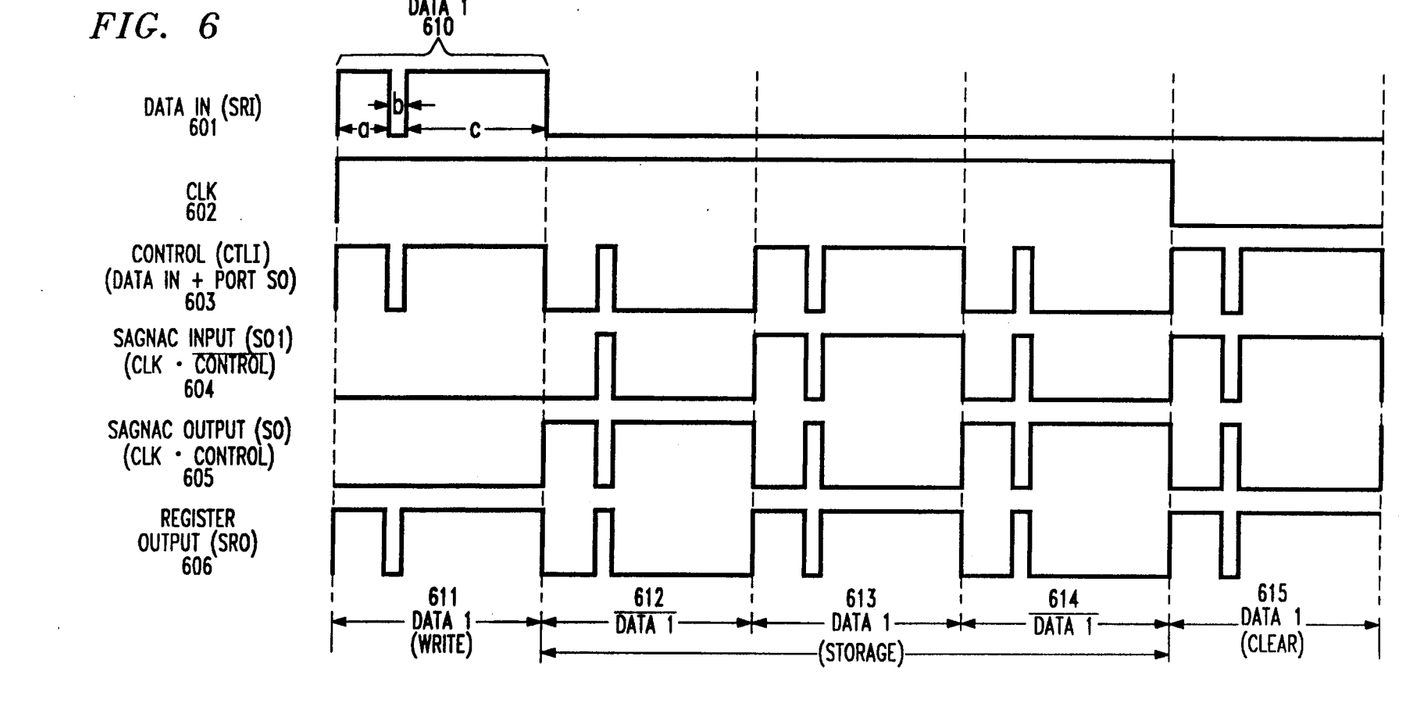
FIG. 6 shows a timing diagram associated with the second embodiment.

FIG. 6 illustrates a data write operation 611, followed by three storage frames 612-614 and a subsequent clear frame 615. At the start of timing sequence, there is no light in the Sagnac loop and the Sagnac ports SO and SOI are logic 0 until the end of the first frame 611. The control input sequence at CTLI and the shift register output sequence SRO are logically equivalent to the data in sequence 601 during the first frame 611. During frame 2, 612, the sequence at port SO is a replica of the sequence at port CTLI of frame 1, 611. The sequence at port SOI is the logical complement control signal at CTLI of frame 1, 611. The sequence leaving port SOI produces the output sequence SRO as well as the new control signal at CTLI for frame 2, 612. Note that the sequence at ports SO1, SRO and CTLI are always the same except during a write frame, 611.

During the storage frames 512-514, the pattern at control port CTLI becomes replicated at port SO. The pattern at port SOI is the logical inverse of the pattern at port SO, and provides the new control signal at port CTLI. This process is repeated for all subsequent storage frames.

The clear frame 515 is affected by interrupting the clock signal 502 to empty the light from the Sagnac loop 10. Because the clock signal is absent, no clock pulses enter the loop and no light is present at ports SOI and SO during the next frame. The pattern at the output SRO (and at the port CTLI) during the clear operation is the inverse of the sequence at port CTLI during the previous frame.

It should be understood that the clear operation depicted in FIG. 6 need not be affected on an entire frame at once, but can be used to selectively clear individual bits in the frame. In this manner, the clear modulator 480 of FIG. 4 can be used to encode data directly on the clock stream to be stored in the shift register.

The output of the circulating shift register can be passively received either at output coupler 50, through the output means provided by coupler C4, or by monitoring the transmitted signal at SO (second embodiment only). At all of these ports, the outputted signal will be at the data rate of the signal which was stored in the loop. An alternative means by which circulating shift register data can be outputted is shown by coupler C5 in FIG. 4 (and by coupler C3 in FIG. 1). A probe pulse at a wavelength which is distinct from the wavelength of the clock signal supply laser 140 can be input to the Sagnac loop in synchrony with the ingoing clock signal pulse. This probe pulse will experience essentially the same nonlinear phase shift as the clock signal pulse, and will be transmitted or reflected accordingly. A coupler could similarly be put on port 1 of coupler 20, with similar results. A filter (F2) can be used to separate the probe signal from the clock signal. The advantage of this technique is that the data can be selectively (and nondestructively) read from the circulating shift register using only a low power laser beam. A probe signal could be injected to select the first pulse on the first round trip, the second pulse on the second round trip, and so on. This has the effect of reducing the data rate (or demultiplexing) to interface a higher data rate optical communications signal with a lower data rate electronic signal. (Note, the previously described modulator 191 provides a multiplexing type capability which enables a lower data rate electronic signal to be multiplexed into the higher data rate optical signal stream.)

The ability of the optical circulating shift register of FIGS. 1 and 4 to replicate a pattern is due to the ability of the Sagnac switch to absorb both amplitude jitter and timing jitter in the loop. If either of these effects is allowed to accumulate, information in the loop will be degraded with each pass and the memory will eventually be corrupted.

The insensitivity to timing jitter is contributed by the nonlinear interaction between signals travelling at different speeds in the Sagnac loop. This has been thoroughly described in the previously referenced patent application of Gabriel et al. The tolerance to jitter is achieved by controlling the birefringence of the fiber in the loop, and the length of fiber between crossed-splices. The jitter tolerance should be chosen large enough to absorb jitter in the clock laser source, as well as any timing mismatches due to slight errors in the length of the delay around the circuit.

The insensitivity to amplitude jitter is due to the sinusoidal dependence of the transmission on the control energy due to the interference which takes place in the Sagnac interferometer. The energy of the logic 0 pulse should be controlled to produce a nonlinear phase shift in the Sagnac loop which is substantially less the $\pi/4$ radians. The energy of the logic 0 pulses is determined in part by imperfections in the fiber circuit (such as an imperfect splitting ratio of the 50:50 coupler of the Sagnac, or imperfections in the polarization properties of the polarization sensitive couplers in the Sagnac switch), so can generally be kept low by careful construction of the circuit. The energy of the logic 1 pulses should be sufficient to give a nonlinear phase shift which is between $\pi$ and $3\pi/2$, to ensure that the switch operates in a stable regime. Adjustment of the energy of the logic 1 pulses can be done by varying the gain of the amplifier in the feedback path to set the energy of the input pulses after passage through all the (slightly lossy) components of the system.

Although the rate of the clock pulses and the rate of the data input pulses can be the same, it should be understood that they need not be the same. If the clock pulses are at at 1/N the rate of the data pulses (N is an integer), the shift register may perform a N:1 demultiplexing function as part of the write operation. If the clock pulses are at a rate which is greater than the data rate, a data sampling function may be performed. A data sampling function of this kind may be useful for detection of asynchronous signals, to find the zero-crossings of a data signal, or for a pulse width modulation communications scheme.

It should be noted in FIGS. 1 and 4 that the output coupler C4 may be placed anywhere in feedback path 120. Also, the shift register output SRO may be obtained at coupler 50 or via any unused port of a coupler. Additionally, in the disclosed encoding means, the function of Sagnac switch 110 may be implemented using a Mach-Zehnder switch or other interferometer switch, using the Kerr effect, and arranged in an analogous manner to that disclosed herein.

What has been described is merely illustrative of the application of the principles of the present invention. Other arrangements and methods can be implemented by those skilled in the art without departing from the spirit and scope of the present invention.

We claims:

1. A circulating shift resister arrangement comprising:
    encoding means utilizing all-optical interaction, including
        means for receiving an optical clock signal,
        control means for receiving an encoded optical signal,
        means for outputting an encoded optical clock signal, wherein said encoding means encodes the received clock signal with a value derived from said encoded signal, and wherein a signal delay caused by said encoding means from said control means to said output means is a prespecified time interval;
    means for coupling the encoded clock signal from said output means to said control means.

2. The shift register arrangement of claim 1 wherein said all-optical interaction includes a nonlinear optical process.

3. The shift register arrangement of claim 1 further comprising means for entering data into the shift register to modify the encoded clock signal.

4. The shift register arrangement of claim 1 further comprising means for modulating said clock signal in response to a received data signal.

5. The shift register arrangement of claim 1 wherein the coupling means includes means for modulating the encoded clock signal in response to a received data signal.

6. The shift register arrangement of claim 1 further comprising means for inputting a received data signal into said control means.

7. The shift register arrangement of claim 6 wherein said received data signal is a plurality of pulses.

8. The shift register arrangement of claim 7 wherein said clock signal is a plurality of pulses and wherein the pulse rate of said clock signal and the pulse rate of said received data signal are substantially synchronized.

9. The shift register arrangement of claim 1 wherein said clock signal is a plurality of pulses.

10. The shift register arrangement of claim 9 wherein the time interval between two or more pulses of said clock signal are substantially equal to said prespecified time interval.

11. The shift register arrangement of claim 1 wherein said encoding means includes a second control means for inputting a received data signal for modulating the encoded clock signal.

12. The shift register arrangement of claim 11 wherein said received data signal is a plurality of pulses.

13. The shift register arrangement of claim 1 wherein said encoding means includes a Sagnac switch including
    an optical transmission medium having a controllable propagation speed characteristic;
    input port means for serially injecting said clock signal into said medium to develop an interacting signal that travels in said medium in one direction and a reference signal that travels in said medium in the opposite direction;
    control port means for injecting a control signal into said medium, said control signal travels through said medium in the direction of said interacting signal, with the timing of said control signal, in relation to said interacting signal, controlled to traverse the control signal by the interacting signal while the interacting signal is traveling through said controllable propagation speed material;
    means for generating a combined signal by combining said interacting signal with said reference signal after said signals have traveled through said medium;
    output port means for outputting said combined signal; and wherein said receiving means is coupled to said input port of said Sagnac switch, said control means is coupled to said control port of said Sagnac switch, and said coupling means couples an output port of said Sagnac switch to said control port.

14. The shift register arrangement of claim 13 wherein
said medium includes an even number of crossed-axis splices.

15. The shift register arrangement of claim 13 wherein
said output port outputs a combined signal in the absence of said control signal.

16. The shift register arrangement of claim 13 wherein
said output port outputs a combined signal when said control signal is present.

17. The shift register arrangement of claim 1 wherein
said output port alternately outputs said encoded clock signal and an inverse of said encoded clock signal.

18. The shift register arrangement of claim 1 wherein
said coupling means includes a feedback path having an optical amplifier connected serially therein.

19. The shift register arrangement of claim 18 wherein
said optical amplifier is an erbium-doped fiber amplifier.

20. The shift register arrangement of claim 1 wherein
said coupling means includes a feedback path causing a predetermined time delay to said encoded clock signal.

21. The shift register arrangement or claim 20 wherein
said clock signal includes a plurality of pulses, wherein said feedback path causes a predetermined time delay to said encode clock signal and wherein said predetermined time delay together with said prespecified time delay enable is sufficient to hold said plurality of clock pulses.

22. The shift register arrangement of claim 1 wherein said encoding means includes a Sagnac switch and wherein
said receiving means is an input port of said Sagnac switch;
said control means is a control port of said Sagnac switch; and
said coupling means couples an output of said Sagnac switch to said control port.

23. The shift register arrangement of claim 1, further comprising
means for inputting a probe signal to said encoding means, means for outputting an encoded probe signal from said encoding means, and wherein
said encoding means encodes the probe signal with a value derived from said encoded signal to produce said encoded probe signal.

24. The shift register arrangement of claim 23 wherein said probe signal is an optical pulse which is substantially synchronized with said optical clock signal.

25. The shift register arrangement of claim 24 wherein the probe signal includes a plurality of pulses at a first pulse rate and said clock signal includes a plurality of pulses at a second pulse rate which is greater than said first pulse rate.

26. An optical circuit arrangement comprising
an optical transmission medium including controllable propagation speed material;
input port means for injecting optical clock pulses into said medium to develop, for each clock pulse, an interacting signal that travels in said medium in one direction and an associated reference signal that travels in said medium in the opposite direction;
control port means for injecting control pulses into said medium, each control pulse travels through said medium in the direction of said interacting signal, with the timing of a control pulse, in relation to said interacting signal, controlled to traverse the control by the interacting signal while the interacting signal is traveling through said controllable propagation speed material;
means for coupling encoded optical data pulses received during a first frame interval, into said control port means;
means for encoding each clock pulse, by combining said interacting signal with said associated reference signal after said signals have traveled through said medium, a first frame interval of clock pulses being encoded to be a replica of said first frame of received encoded data pulses;
means for coupling said first frame of encoded clock pulses into said control port means, said first frame of encoded clock pulses being used by said encoding means to encode a second frame of clock pulses; and
means for outputting said encoded clock pulses.

27. An optical circuit arrangement comprising
an optical transmission medium including controllable propagation speed material;
input port means for injecting optical clock pulses into said medium to develop, for each clock pulse, an interacting signal that travels in said medium in one direction and an associated reference signal that travels in said medium in the opposite direction;
control port means for injecting control pulses into said medium, each control pulse travels through said medium in the direction of said interacting signal medium in the direction of said interacting signal, with the timing of a control pulse, in relation to said interacting signal, controlled to traverse the control pulse by the interacting signal while the interacting signal is traveling through said controllable propagation speed material;
means for coupling encoded optical data pulses, received during a first frame interval, into said control port means;
means for encoding each clock pulse, by combining said interacting signal with said associated reference signal after said signals have traveled through said medium, a first frame interval of clock pulses being encoded to be an inverse replica of said first frame of received encoded data pulses;
means for coupling said first frame of encoded clock pulses into said control port means, said first frame of encoded clock pulse being used by said encoding means to encode a second frame of clock pulses; and
means for outputting said encoded clock pulses.

* * * * *